United States Patent [19]

Devin

[11] Patent Number: 5,537,349
[45] Date of Patent: Jul. 16, 1996

[54] MEMORY IN INTEGRATED CIRCUIT FORM WITH IMPROVED READING TIME

[75] Inventor: Jean Devin, Aix En Provence, France

[73] Assignee: SGS-Thomson Microelectronics S.A., Saint Genis, France

[21] Appl. No.: 361,996

[22] Filed: Dec. 21, 1994

[30] Foreign Application Priority Data

Dec. 22, 1993 [FR] France ................... 93 15499

[51] Int. Cl.$^6$ .......................................... G11C 16/04
[52] U.S. Cl. ..................... 365/185.33; 365/203; 365/204; 365/208; 365/194
[58] Field of Search .................... 365/185, 203, 365/204, 185.33, 208, 194

[56] References Cited

U.S. PATENT DOCUMENTS

| | | | |
|---|---|---|---|
| 4,616,344 | 10/1986 | Noguchi et al. | 365/203 |
| 4,860,256 | 8/1989 | Devin et al. | 365/189 |
| 4,947,375 | 8/1990 | Gaultier et al. | 365/200 |
| 4,958,324 | 9/1990 | Devin | 365/201 |
| 4,964,079 | 10/1990 | Devin | 365/168 |
| 5,022,001 | 6/1991 | Kowalski | 365/185 |
| 5,058,069 | 10/1991 | Gaultier et al. | 365/200 |
| 5,099,451 | 3/1992 | Sourgen et al. | 365/185 |
| 5,177,707 | 1/1993 | Edme | 365/203 |
| 5,303,189 | 4/1994 | Devin et al. | 365/189 |

FOREIGN PATENT DOCUMENTS

| | | | |
|---|---|---|---|
| 0107415 | 5/1984 | European Pat. Off. | G11C 11/40 |
| 0313431 | 4/1989 | European Pat. Off. | G11C 17/00 |
| 0421839 | 4/1991 | European Pat. Off. | G11C 16/06 |

OTHER PUBLICATIONS

Electronics, vol. 56, No. 24, Dec. 1, 1983, New York US pp. 118–121, Mehrotra et al. "Oxynitride film yields long-lived 64–K EE–PROM cells".

IEEE Journal of Solid–State Circuits, vol. 24, No. 5, Oct. 1989 New York US, pp. 1250–1258, Hoff et al. "A 23ns 256K EEPROM with double layer metal and address transition detection".

IEEE Journal of Solid–State Circuits, vol. 25, No. 5, Oct. 1990, New York US, pp. 1141–1146, Kuriyama et al. "A 16–ns 1–Mb CMOS EEPROM".

Patent Abstracts of Japan, vol. 12, No. 16 (P–656) Jan. 19, 1988 & JP–A–62172595 (Mitsubishi Electric Corp.).

*Primary Examiner*—David C. Nelms
*Assistant Examiner*—F. Niranjan
*Attorney, Agent, or Firm*—David M. Driscoll; James H. Morris

[57] ABSTRACT

A random-access memory with an accelerated access time. One or more of the preliminary operations of the sequence of operations carried out for accessing the memory are anticipated by performing the anticipated operation or operations during the end of a sequence of a previous memory access. The anticipated operation is preferably that of the deselection of the bit lines of the memory.

41 Claims, 2 Drawing Sheets

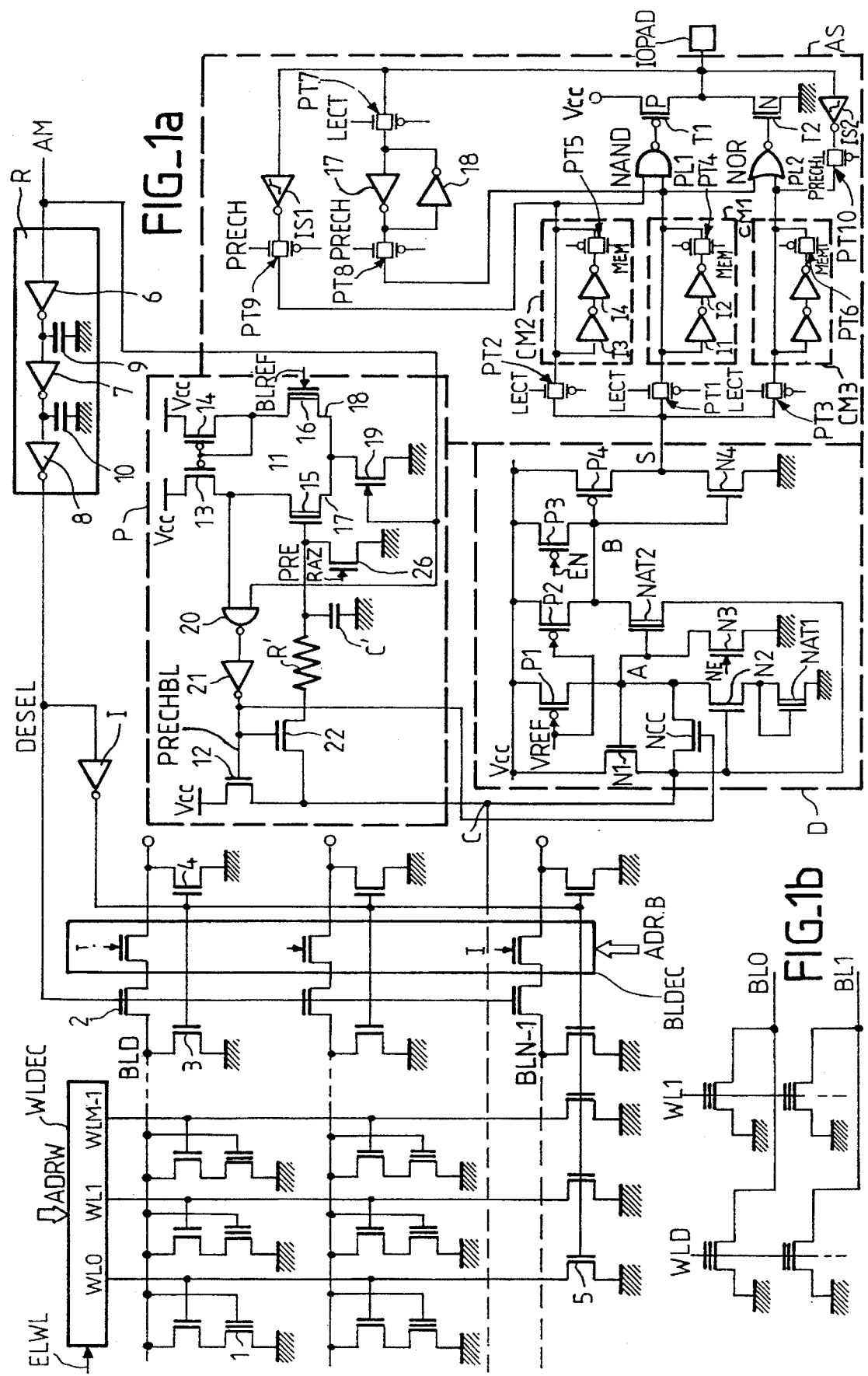

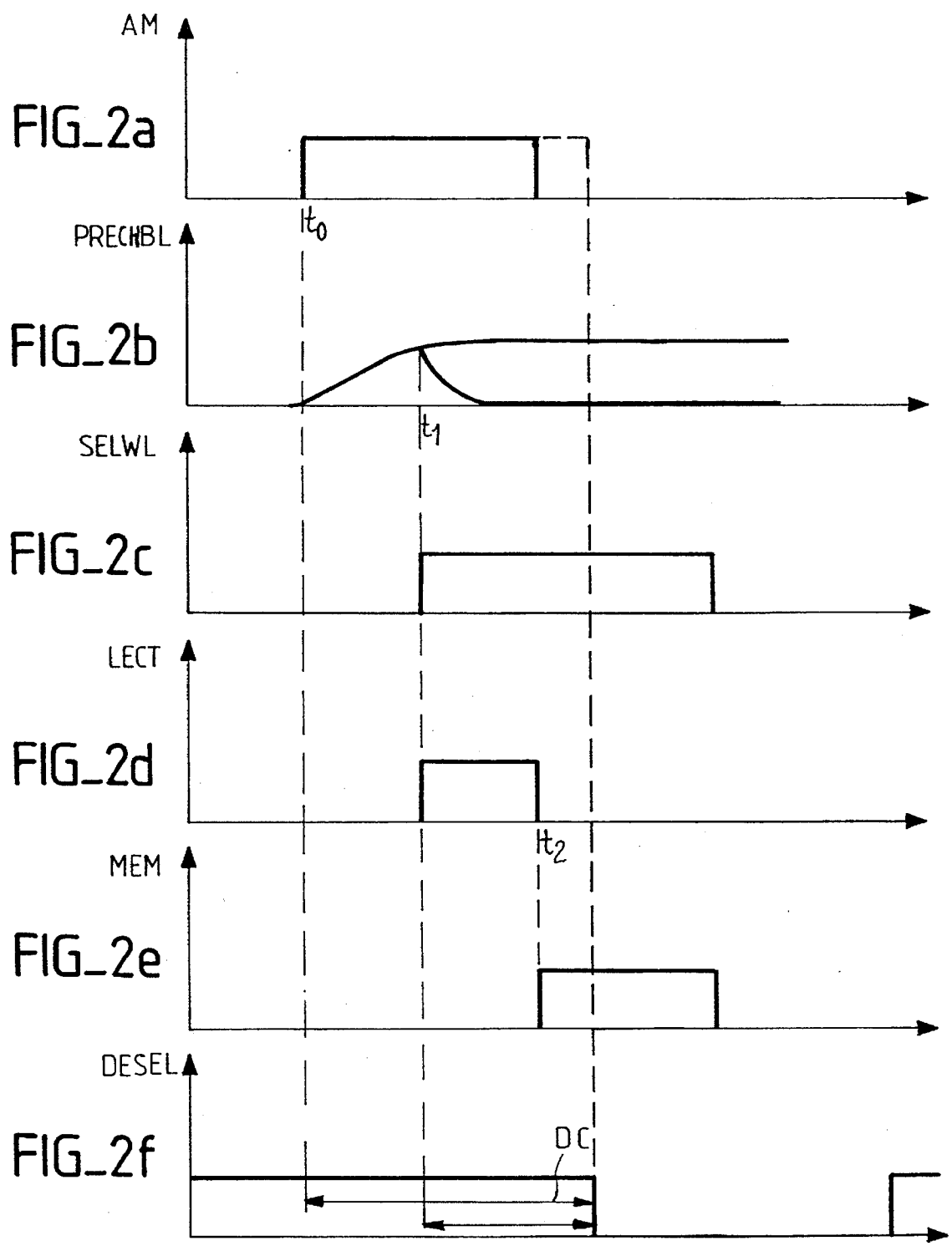

MEMORY IN INTEGRATED CIRCUIT FORM WITH IMPROVED READING TIME

BACKGROUND OF THE INVENTION

1. Field of the Invention

The present invention is directed to a random-access memory in integrated circuit form with an accelerated reading cycle. This acceleration is due to a novel organization of the reading operations. The same principle can also be applied to writing. The invention can be applied more particularly in the field of EPROM type memories or in that of EEPROM type memories wherein the memory cell has a floating-gate transistor as its storage element. In these fields, it is particularly well-suited to flash EPROM type memories.

2. Discussion of the Related Art

EPROM memories are non-volatile memories wherein the writing is done electrically, cell by cell, but for which the erasure is total: by ultraviolet radiation. EEPROM memories are also non-volatile memories but their writing and erasure are electrical. The erasure however is done by blocks of memory cells. The flash EPROM memories are non-volatile memories for which the writing and erasure are electrical with, however, particular constraints of use. For these memories, the invention makes a promising contribution because, apart from the acceleration obtained in reading, it restricts the effects of these constraints.

The memory cells of a memory are organized in matrix form at the intersections of rows and columns: the rows are called bit lines and the columns are word lines. To gain access to the information contained in a memory cell, decoders are used to select a bit line and a word line characteristic of the memory cell to be read. The selection of a memory cell is designed to connect it to a detection circuit, which is generally a current sensing circuit. The memory cell constituted by the floating gate transistor then behaves, depending on its programmed state, like a low-value resistor or like an open circuit. If it is a resistor, the bit line to which it belongs is, at the time of the selection, connected to the ground of the circuit of the memory. Thus, a discharge current may flow in the bit line. However, if it is an open circuit, a voltage applied beforehand to the bit line is kept. A current sensor detects or does not detect the passage of discharge current. Consequently, a static electrical state, the electrical state programmed in the memory cell, has been converted into a dynamic electrical state: namely a state that varies in time. This change in state is then used in the different circuits connected to the memory.

As described, the process requires the precharging of the bit line at a certain voltage, before the selection of the memory cell concerned by the bit line. The current sensor circuit is connected to the bit line at least at the end of this precharging operation. As soon as the concerned word line is activated, the phenomenon of short circuit or open circuit occurs and current flows or does not flow through the current sensor. Since the current sensor is thus connected beforehand to the bit line, methods for precharging the bit line have been developed wherein the precharging circuit of the bit line is integrated with the current sensor.

Before the precharging, in the case of the EEPROM memories, it is necessary however to reset the bit lines and word lines at zero so that the precharging is done properly, notably so that firstly it starts and secondly the precharging voltages of the different bit lines are the same. In the case of the EPROM memories, the word lines must be grounded or taken to a voltage lower than the reading voltage so as not to affect the cells. Before the precharging in this case, the bit lines are taken to high impedance: they are disconnected from the sensing circuits. In practice, all the connections and impositions of voltage depend firstly on the technology chosen (EPROM-EEPROM) and secondly on the embodiment of the reading circuits.

The problems encountered with memories of this type are generally related to their speed. For example, for the reading, the operations of resetting the bit lines, precharging the bit lines, reading and read storage should take less time than the nominal period of time stated for a range of circuits. It is becoming increasingly difficult to meet this speed requirement because the sizes of the memories are tending to increase. Consequently, these bit lines and word lines are longer and the period of propagation of the signals becomes great. This means that it is no longer possible to comply with the nominal period of time. To accelerate these operations, the French patent application No. 89, filed on 2 Oct. 1989, and published under No. 2 652 672, has already provided for making the bit line precharging operation faster. In a French patent application No. 92 09197, filed on 24 Jul. 1992, a method has been devised for precharging also an output amplifier so that the build-up time of this amplifier does not entail being subjected to a delay at transmission.

SUMMARY OF THE INVENTION

In one illustrative embodiment of the invention, an integrated circuit memory is provided whose memory cells are connected to bit lines and word lines comprising:

- a circuit connected to these bit lines and/or word lines to place these bit lines and/or word lines in a state of high impedance and/or to connect them to a basic voltage,
- a precharging circuit connected to these bit lines to precharge these bit lines at a read or write voltage that is different from the basic voltage,
- and a read or write circuit controlled by a read or write signal to read or write these electrical states, and
- a delay circuit, activated by the read or write circuit, to place these bit lines and/or word lines in a state of high impedance and/or to connect them to a basic voltage source with a calibrated delay following the reading or writing of these electrical states resulting from the application of the read or write signal.

BRIEF DESCRIPTION OF THE DRAWINGS

The invention will be understood more clearly from the following description and from the accompanying figures. These figures are given purely by way of an indication and in no way restrict the scope of the invention. Of these figures:

FIGS. 1a and 1b give a schematic view of a memory according to the invention. FIG. 1a shows an illustrative embodiment of an EPROM because of its complicated read circuit. An EPROM memory cell is shown in FIG. 1b;

FIGS. 2a to 2f are timing diagrams of signals implemented in the invention.

DETAILED DESCRIPTION

The present invention overcomes the problem of the prior art by organizing the various operations of reading in a memory differently. In particular, rather than keeping a sequence, namely the resetting of the bit lines or word lines, the precharging of these lines, the reading of the memory cells and then, if necessary, a read storage, the invention recommends a reversed sequence. In the reversed sequence, a precharging and then a reading operation are carried out. If necessary, what has been read is stored and then, after a calibrated period of time after the reading, the bit lines or the word lines are reset or again they are placed in a state of high impedance depending on the technology chosen.

Consequently, it is possible to have a faster sequence since, finally, at the end of the reading, one of the operations relating to a following reading has been anticipated. In practice, with successive operations of reading in the memory, the same operations are carried out in the same order but one of these operations, the deselection of the bit lines and word lines selected beforehand is done at the end of a read cycle and not at the start of this cycle as in the prior art. It is shown that it is then possible to gain about five nanoseconds on a complete read cycle since this resetting operation is done during a period which, otherwise, was neutralized, for example in order to await the end of reading before permitting a subsequent reading.

Furthermore, by acting in this way, so long as a bit line is not selected, it is in a non-critical voltage state. Indeed, in the prior art, when a bit line has been read but none of its memory cells has been equivalent to a short circuit, the voltage in this bit line remains high, for example 3 volts. Ultimately, such an excitation applied to a source region of a floating-gate transistor may lead to a slight programming of this transistor. The memory gets programmed spontaneously. This is all the more critical for the flash EPROMs as these memories, like the EPROMs, do not have any series-connected control transistor and as they have, like the EEPROM memories, a thin gate oxide. They are therefore permanently acted upon.

Besides, it is not necessarily obligatory to reset the bit lines. Depending on the manufacturing technologies and the read circuits used, it is possible to limit the operation to placing the bit lines in a state of high impedance (so that they are no longer connected to high voltage sources of the circuit) and, generally, the word lines are connected to the ground during this resetting operation.

FIG. 1a shows a memory according to the invention of the type whose memory cells such as 1 comprise a floating-gate transistor and are connected to bit lines BL0 to BLN-1 and word lines WL0 to WLM-1. These bit lines and word lines are furthermore connected to decoders, BLDEC and WLDEC respectively, of bit lines and word lines. The memory has a so-called deselection circuit also connected to these bit lines and/or word lines to place these bits lines and/or words lines in a state of high impedance and/or to connect them to a basic voltage source. For example, this deselection circuit has, firstly, N type transistors such as the transistor 2 series-connected to the bit lines and connecting these bit lines with the outputs of the decoder BLDEC when they receive, at their control gate, a deselection signal DESEL at a state 1. When they receive a signal DESEL in a state 0, they are off. The bit lines are unconnected: they are uncoupled from the decoder BLDEC.

The deselection circuit also has N type transistors such as the transistors 3 and 4 receiving, at their control gate, a signal that is complementary to the signal DESEL produced by an inverter I, these N type transistors being connected by their drain and source regions on one side of a bit line and on the other side to the ground. In this case, the basic voltage is the ground voltage but this is not obligatory. The transistor 3 is placed on one side of the decoder BLDEC physically corresponding to the position of the bit line. The transistor 4 is placed on the same bit line on the other side of the decoder BLDEC corresponding to the sensor D. When DESEL equals zero, the bit line and the inputs and outputs of the decoder BLDEC are thus grounded.

The deselection circuit finally has N transistors such as 5 connected between the word lines and the ground and also receiving the signal complementary to the signal DESEL at their control gate. At the time of the deselection, when the signal DESEL is equal to one, the word lines are thus grounded.

It is possible to design another circuit, notably with transistors of opposite types, controlled by signals also of opposite types. It is also possible, during the resetting phase, to limit the operation to placing the bit lines in a state of high impedance. FIG. 1b shows an EPROM type memory cell in which the floating gate transistor is directly connected by its drain to the bit line and by its source to the ground. The control gate of this transistor is connected to the word line. The principle of the reading is the same.

The memory also has a precharging circuit P connected to these bit lines to precharge these bit lines at a reading or writing voltage that is different from the basic voltage. In practice, if the supply voltage Vcc of the circuit is equal to 3 volts, a read precharging voltage is of the order of 1.2 volts. It also has a read circuit D controlled by a read signal AM to read these electrical states. The signal AM is, in practice, a signal produced by an addressing of the memory. As soon as an address transition signal is received at an address bus of the memory, a known type of circuit is used to produce the signal AM. This signal may also be the standard reading signal of a memory and may be produced outside the integrated circuits. Thus, the circuits that participate in the reading of a cell are likened to the read circuit. This is so notably if there is a circuit (not shown) for the detection of address transitions A characteristic of this embodiment is that the memory has a delay circuit R activated by the read circuit (for example by the signal AM produced for this read circuit) to place these bit lines and/or word lines in a state of high impedance and/or to connect them to a basic voltage with a calibrated delay following the reading of these electrical states resulting from the application of the reading signal. In one example, the circuit R has an analog delay line constituted by series-connected inverter cells 6 to 8 whose connection nodes are connected by capacitors 9 to 10 to a fixed voltage, for example the ground. When a pulse is transmitted to a series of cells such as this, the output of this pulse is delayed by the time taken to load the capacitors interposed in parallel. This delay circuit is capable, in the present case, of proposing a delay of the order of 40 nanoseconds. It is possible, furthermore, to provide for intermediate connections in order to have shorter delays.

A sensing and precharging (D and P) circuit is shown in FIG. 1a. With a circuit such as this, it is possible to precharge bit lines which can be likened, at the instant of precharging or reading, to an RC circuit at the end of a period substantially equal to 10 ns.

The working of the sensor circuit D and precharging circuit P are as follows. At the outset, any selected bit line is connected to a node C while the signal DESEL is equal to one. The potential of the concerned bit line is then at VSS, equal to zero volts. To precharge the bit line, the sensor D is activated, for example by means of a signal VREF that is applied to the gate of a P type transistor P1. The transistor P1 is connected firstly to Vcc (supply voltage) and secondly to a node A. The control by VREF is aimed at taking A to the value of Vcc. In doing so, an N type transistor N1 that is connected by its drain to the potential Vcc and that receives the potential of the node A at its gate becomes conductive. This is also the case with a native transistor NAT2 which receives the potential of the node A at its gate and has its drain also connected to Vcc by the placing of a P type transistor P2 in a state of conduction. The transistor P2 too is controlled by the control potential VREF. The transistors N1 and NAT2 then load the bit line to which they are connected, at the node C, by their source. The voltage of the node C rises. The rising of the voltage of the node C rises prompts the placing of an N type transistor N2 in a state of conduction. The transistor N2 is cascade-connected between the transistor P1 and an N type transistor NAT1, between Vcc and the ground. The transistor N2 receives the voltage from the node C at its gate. The transistor NAT1 is mounted as a diode because of the connection of its gate to its drain.

A negative feedback is then exerted on the voltage of the node A. The voltage of the node A therefore gets stabilized at an intermediate voltage determined by the transistors P1, N2 and NAT1. The transistor NAT1, because its gate is short-circuited to its drain, behaves like a diode: it is used to increase the voltage of the node A as soon as a current goes into the transistor N2 and into the transistor NAT1. The voltage at the node C is then equal to the conduction threshold voltage VT of the transistor N2 (VTN2) added to the conduction threshold voltage of the transistor NAT1 (VTNAT1), namely 1.2 volts.

Indeed, if the voltage at C rises, the transistors N2 and NAT1 tend to be conductive to a greater extent and cause the voltage at the node A to fall. The voltage C then decreases naturally through the fact that the transistors N1 and NAT2 then become less conductive. However, if the voltage at C falls, these two transistors tend to be less conductive and the reverse phenomenon occurs. Thus the transistors N1 and NAT2 load the bit line until the voltage C has reached this value.

At the time of the reading, the bit line to be read may or may not be considered to be a weak resistor of the link between the node C and the ground, depending on the state of programming of the memory cell to be read in this bit line. When there is a link to the ground, the voltage at the node C drops suddenly and the transistor NAT2 has to let through a great deal of current. As the control of the transistor NAT2 has not varied, since the voltage of the node A remains at the same potential during the reading operation, the result thereof is that the voltage of an intermediate node B between the transistor P2 and the transistor NAT2 rises abruptly. By contrast, if at the time of the reading no short circuit has been detected, the voltage at the node B remains at its initial low value. An output inverter assembly P4-N4 connected to this node B switches over or does not switch over, respectively, as a function of this reading. The output S respectively delivers a high signal (Vcc) or a low signal (Vss).

The essential part of the slowness of the loading of the bit lines arises from the negative feedback circuit NAT2-N2-NAT1. To overcome this drawback, the illustrated embodiment of the invention also uses a circuit P for the precharging of the bit lines that is independent of the sensor D itself and is far more powerful. Furthermore, to prevent manufacturing disparities as well as to limit the space taken up by the implantation due to an additional precharging circuit that is more powerful, it is possible to provide for short-circuiting all the bit lines to be precharged together at the time of the precharging. Consequently, there is obtained a precharging that has the following qualities all together: it is fast, identical for all the lines and does not take up much additional space. The precharging circuit P has a differential amplifier 11. This differential amplifier 11 receives, firstly, a bit line voltage reference signal BLREF that has to be compared with a signal PRE for the effective precharging of the bit line. This differential amplifier 11 delivers a signal PRECHBL to control the precharging of the bit line. This bit line precharging control signal is applied as a control to a power transistor 12 which is connected at the node C to the bit line in order to precharge it. By its other terminal, the transistor 12 is connected to the supply Vcc of the circuit.

The structure of the circuit P may be as follows. Two enhanced P type transistors, 13 and 14 respectively, are cascade-connected with two native N type transistors 15 and 16, connected together by their sources 17 and 18 respectively. The common node of the sources 17 and 18 is furthermore connected to the ground by an N type transistor 19. The native transistors 15 and 16 form the differential stage. At their gate, they receive the signals PRE and BLREF respectively. The two gates of the two P type transistors 13 and 14 are connected together and are connected at the same time to the drain of the transistor 14. The transistors 13 and 14 form a current mirror to impose proportional currents in both arms of the amplifier 11.

At the start of the precharging operation, the voltage available on the bit line, at the node C, is zero. Consequently, the bit line precharging signal PRE is zero. When precharging is to be done, a positive signal AM is sent to the control gate of the transistor 19. In doing so, the sources 18 and 17 of the native transistors 16 and 15 may be considered to be connected to the ground. The differential amplifier 11 is then put into operation. When the sources 17 and 18 are connected to the ground, the transistors 14 and 16 become conductive. Consequently, the transistor 13 also becomes conductive. However, since the effective precharging signal PRE applied to the control gate of the native transistor 15 is then zero, the drain-source voltage of the transistor 15 is great. Consequently, the drain of the transistor 13 is taken to the supply potential: Vcc. The potential of the drain of the transistor 13 as well as the command AM for the validation of the operation of the differential amplifier are applied to the inputs of a NAND gate 20 which then delivers a zero logic state. This zero logic state is introduced into the input of an inverter 21 which delivers a signal to control the precharging of the bit lines PRECHBL now in the state 1. This command in the state 1 makes the bit line charging transistor 12 conductive.

The bit line precharging signal is furthermore taken from the node C and is led, by means of an R'C' simulation circuit to the control gate of the native transistor 15 as a signal PRE. The R'C' circuit is a circuit for simulating the charging of a bit line. This R'C' circuit actually exists: its indication is not symbolic here. The aim of this circuit is to obtain knowledge of the effective voltage for precharging the bit line, at the end of the bit line, and not at its input. The midpoint of the R'C' circuit therefore delivers a signal PRE for the effective precharging of the bit line.

The R'C' circuit could have been replaced by a real additional bit line, for example of the type used in repairs. However, the choice of a R'C' circuit is preferred because it takes up less space. Furthermore, since several bit lines are precharged at the same time, it would be necessary to create a simulation of the precharging of several bit lines at the same time. This cannot be equivalent to the precharging of only one bit line.

As soon as the signal for the effective precharging of the bit line has reached the level laid down by the reference signal BLREF, the drain/source voltage of the transistor 15 starts decreasing, the differential amplifier 11 switches over and the bit line precharging control signal PRECHBL changes state: it goes back to the zero state. In doing so, the transistor 12 goes off. At this time, the precharging is over and the bit line is available for the reading proper. Furthermore, a transistor 22, series connected between the node C and the circuit R'C,' and also controlled by the precharging control signal PRECHBL, goes off too. It then uncouples the differential amplifier 11 from the memory reading circuit. This action prevents any distortion of the measurement of the drop in voltage at the node C owing to the presence of the capacitors of the differential amplifier 11 (and of that of the R'C' circuit) which could delay the switching of the inverter P4 N4.

The presence of the bit line precharging control signal could be advantageously used to short-circuit all the bit lines together. The fact of short circuiting the bit lines together at the time of precharging has the second advantage of ensuring that all the bit lines will be precharged at one and the same value and that this value will thus be independent of the disparities in the characteristics of the precharging transistors of the sensors themselves. In order that the differential amplifier 11 may be very fast, the P type transistors 13 and 14 are preferably big transistors. Furthermore, the comparison transistors 15 and 16 are preferably native transistors. Indeed, the zone of efficient operation of an N type differential amplifier ranges from 2VT to Vcc. Now, the threshold voltage VT of a normal N type transistor (namely an enhanced N type transistor) is of the order of 1.5 volts. Consequently, a differential amplifier of this type would work well when the voltages to be compared, PRE and BLREF, are greater than 3 volts and below Vcc. Now, this is not so since the precharging voltage to be obtained is equal to 1.2 volts. By keeping native transistors whose conduction threshold voltage VT is of the order of 0.2 volts, it is easy to obtain a satisfactory range of operation.

The presence of the differential amplifier 11 makes it possible to precharge the bit lines as if it were desired to reach a precharging value of Vcc by means of the transistor 12. The bit line precharging time constant is not changed. However, given that the goal that has been set in terms of voltage is greater, the 1.2 volt threshold is attained more speedily than if the goal had been precisely the obtaining of this threshold. The differential amplifier makes it possible to cut off the precharging as soon as this voltage has been reached. Furthermore, with the differential amplifier 11, the negative feedback NAT2, NAT1, N2 becomes no longer preponderant.

According to a particular embodiment of the invention, an output amplifier AS works in two phases: first precharging and then transmission of the logic level of the signal S. The amplifier AS has two output transistors that are used to give the desired logic level at a pad IOPAD. These are respectively a charging transistor T1 and a discharging transistor T2. In CMOS technology, the transistor used will be a P channel charging transistor having its source connected to a positive supply terminal Vcc and an N channel discharging transistor having its source connected to a low supply terminal, the ground for example. The drains of the transistors are connected to the pad IOPAD. The transistor T1 must be conductive and T2 must be off when the signal S corresponds to the placing of the pad IOPAD at the high logic level. Conversely, the transistor T1 should be off and the transistor T2 on when the signal S corresponds to the placing of the pad at the low logic level.

It will be understood that if a first reading of information has led to the placing of the pad IOPAD at a high potential, the second reading will give a fast information element if it must also lead to a high level but it will give a slower information element if it has to lead to a low level for, in the latter case, it is necessary to take the time needed to discharge the pad and the external lines connected to this pad. Conversely, if the previous reading had placed the pad at a low level, the obtaining of an information element will be delayed if the new information element corresponds to a high logic level.

To balance the speed with which the information is given in the two possible cases (the successive supply of two identical levels or the supply of two different levels), the output pad is precharged at an intermediate value between the two logic levels during a precharging phase that immediately precedes the reading proper. The logic levels considered herein are the standard levels allowed in the technology used. For example, in CMOS technology these levels may be 0.8 volt levels for the low level and 2 volts for the high level. The intermediate value could be equal to about 1.4 volts. The sequencing of the operations will therefore include, starting from an instant t0 defined by the detection of a change in address AM of information to be read, firstly a precharging phase PRECH (t0 to t1, with a duration of 30 nanoseconds for example) and then a reading phase LECT (t1 to t2 of the order of 10 nanoseconds) and then a stage of waiting for a new change in address of the information to be read.

It will be noted that this additional precharging phase cannot entail any loss of time if it can be done at the same time as the phase for the precharging of the bit line BL before the preparation of the signal S. With the invention, it is even possible to anticipate this precharging by activating it by the end of a previous reading.

A first logic gate PL1 activates the gate of the transistor T1 and a second logic gate PL2 activates the gate of the transistor T2. In the example shown, the logic gate PL1 is a two-input NAND gate and the logic gate PL2 is a two-input NOR gate. During the reading phase, the first input of the NAND gate PL1 receives the signal S representing the information to be transmitted to the output pad. The first input of the NOR gate receives the same signal. The output of the amplifier N4-P4 is connected to these first inputs by means of a transfer gate PT1 that is open only during the reading phase proper, after the precharging phase. The signal LECT which activates certain transfer gates of the figure defines this reading phase (see FIG. 2). The transfer gates are constituted by an N channel MOS transistor controlled by a logic signal, in parallel with a P channel MOS transistor controlled by a complementary logic signal.

The second input of the NAND gate PL1 also receives the signal S through another transfer gate PT2, which is on during the reading phase LECT. In the same way, the first input of the NOR gate PL2 receives the signal S through the gate PT1 and the second input receives the signal S through a transfer gate PT3 that is turned on by the signal LECT.

For reasons pertaining to the need for the very swift releasing of the differential amplifier P4-N4 for a new reading operation even before the information has been completely stabilized at the pad IOPAD, there is provision for auxiliary holding circuits that store and hold the value of the signal S at the inputs of the logic gates PL1 and PL2 even after the disappearance of the signal S. There is also a holding circuit after each transfer gate PT1, PT2, PT3. Each holding circuit, CM1, CM2, CM3 respectively has a servo-controlled loop comprising two cascaded inverters, series-connected with a transfer gate. The input of the second inverter is connected to the output of the first one, the output of the second inverter is connected to the input of the transfer gate and the output of this transfer gate is looped to the input of the first inverter. The transfer gate of the holding circuit is controlled by a signal MEM which saves the information (S) as soon as the signal S corresponding to a new reading has assumed its new value. The signal MEM appears as soon as the reading phase (LECT) ends and is held normally up to the next precharging phase, namely throughout the period of waiting before the detection of a change in address of information to be read.

The first holding circuit CM1, corresponding to a double inverter I1, I2 and a transfer gate PT4, is connected to the output of the gate PT1, i.e. the input of the inverter I1 and the output of the gate PT4 are connected to this output of the gate PT1.

Similarly, the second holding circuit CM2 (inverters I3, I4, transfer gate PT5 controlled by the signal MEM) is connected to the output of the transfer gate PT2. The third holding circuit CM3 (inverters I5, I6, transfer gate PT6 controlled by the signal MEM) is connected to the output of the transfer gate PT3.

When the signal LECT is sent out to apply the signal S to the gates PL1 and PL2, the signal MEM is in the low state (gates PT4, PT5, PT6 off). The reading signal LECT makes the gates PT1, PT2, PT3 conductive. The signal S appears at the inputs of the gates PL1 and PL2 and then gets stabilized. The signal LECT can then be put back into the low state and the signal MEM applied is applied to the gates PT4, PT5, PT6 to turn them on and activate the holding circuits to memorize the signal S. The logic value of the signal S then continues to be applied to the inputs of the logic gates PL1 and PL2 even if the output of the amplifier P4-N4 stops giving the signal S. It is therefore possible, from this instant onwards, to carry out the operation of deselection which reinitializes the sensor D.

If the signal S is at high logic level (1), the output of the NAND gate goes to zero since both its inputs are at 1. The charging transistor T1 is then made conductive, charging the pad IOPAD at the high logic level from the high supply terminal A. The transistor T2 remains off, the output of the NOR gate being at 0 because both its inputs are at 1. If, on the contrary, the signal S is at a low logic level(0), the output of the NOR gate goes to 1 and makes the discharging transistor T2 conductive to make the output pad go to the level 0. The NAND gate gives a level 1 that turns the transistor T1 off.

For the precharging of the amplifier AS, the following specific additional elements are preferably planned: an inhibition circuit for the inhibition of one of the gates PL1 and PL2 as a function of the previous logic state of the pad IOPAD and a threshold sensor to restrict the precharging of the pad IOPAD at a determined value.

In the preferred embodiment, a circuit is provided to store the previous logic value of the pad IOPAD. This circuit, for example, has an inverter 17 looped by another inverter I8 that is more resistive than the former one. The input of this storage circuit (input of the inverter 17) is connected to the pad by means of a transfer gate P17 that is turned on during the reading phase LECT. The storage circuit therefore stores the state of the pad during the reading stage. The output of the storage circuit (output of the inverter 17) is connected to the first input of the NAND gate PL1 and the first input of the NOR gate PL2 by means of a transfer gate PT8 turned on during the precharging stage PRECH. The logic state present at the pad, inverted by the inverter 17 and memorized by this inverter, is therefore transmitted to other input of the NAND and NOR gates throughout the precharging phase.

The output of the storage circuit is used simply to inhibit the working of either of the gates PL1 and PL2 to prohibit the conduction of the charging transistor or of the discharging transistor according to the logic state of the pad at the previous reading: if the stored logic state is 1, a 0 state is transmitted to the input of the NAND gate during the next precharging phase. This prohibits the conduction of the transistor T1 irrespectively of the state of the other input. The NOR gate is not affected and may cause the transistor T2 to be conductive depending on the state of the other input of this gate. Conversely, if the state of the pad at the previous reading is 0, a 1 state is transmitted by the storage circuit during the next precharging phase to prohibit the conduction of the transistor T2. The conduction of the transistor T1 will not be inhibited and will depend on the state of the other input of the NAND gate.

The second input of the NAND gate PL1 receives the output of a transfer gate PT9 which itself receives the output of a threshold inverter IS1, the input of this inverter being connected to the pad IOPAD. It may be recalled that the second input of the NAND gate furthermore receives the signal S by the output of the holding circuit CM2. However, during the precharging phase PRECH, the signal LECT and the signal MEM are at zero, turning the gates PT2 and PT5 off, so that the signal S is no longer transmitted actively to the inputs of the NAND and NOR gates.

In the same way, the second input of the NOR gate PL2, which no longer receives the signal S of the previous reading during the precharging phase PRECH, receives the output of a threshold inverter IS2 by means of a transfer gate PT10 activated by the signal PRECH.

The threshold inverters are used to permit the placing, in a state of conduction, of that one of the transistors T1 or T2 whose conduction is not prohibited by the inhibition circuit during the precharging. This conduction is permitted for as long as the potential of the pad has not reached the desired intermediate precharging value. It is then stopped.

The threshold of the inverters IS1 and IS2 is set at a value that is directly related to the value of the precharging potential to be applied to the pad IOPAD during the precharging phase.

Indeed, the circuit works as follows: if the previous reading signal S is at 1, the pad is charged at about 5 volts at the end of the reading step. During the precharging phase, which prepares the next reading operation, the NAND gate is inhibited by the output of the gate PT8. The NOR gate receives a logic state 0 at its first input by the gate PT8 and a logic state 0 by the threshold inverter since the pad is at 1. The NOR gate gives a high level at its output. The discharging transistor T2 becomes conductive and discharges the high potential of the pad IOPAD. The potential of this pad falls. However, as soon as it reaches the desired precharging value, defined by the threshold of the inverter IS2, the inverter IS2 switches over, causes the NOR gate to switch over and turns the transistor T2 off so that the discharging of the pad stops. The pad remains charged at the desired precharging value which is an intermediate value between a high logic level and a low logic level. The situation then remains as such until the end of the precharging phase PRECH and up to the appearance of the signal LECT which defines the new reading phase.

Conversely, if the signal S of the previous reading was at 0, the pad is initially discharged to 0 volts at the end of the reading step. During the precharging phase, which prepares the next reading operation, it is the NOR gate that is inhibited this time by the output of the gate PT8. The NAND gate receives a logic state 1 at its first input through the gate PT8 and a logic state 1 by the threshold inverter IS1 since the pad is at 0. The NAND gate therefore gives a low level at its output. The charging transistor T1 becomes conductive and charges the pad IOPAD. The potential of this pad rises. As soon as it reaches the desired precharging value, defined by the threshold of the inverter IS1, the inverter IS1 gets switched over, causes the NAND gate to get switched over and turns the transistor T1 off, so that the charging of the pad stops. The pad remains charged at the desired precharging value which is an intermediate value between a high logic state and a low logic state.

Since it is difficult to make a threshold inverter that works without hysteresis, namely a threshold inverter that switches over for the same input voltage value in the increasing order of voltages as well as in the decreasing order of voltages, it is preferred to use two separate inverters IS1 and IS2. However, it will be understood that if hysteresis is accepted, the two inverters could be replaced by a single inverter since they are parallel-connected.

The level of the intermediate potential at which the pad is precharged preferably ranges from 1 to 2 volts for a voltage supply of 5 volts, and an appropriate value is about 1.4 volts. Although the supply is equal to 5 volts, the low logic level is considered to have a value of less than about 0.8 volts and the high logic level is considered to have reached a value of about 2.2 volts. This explains the values given as preferred intermediate ranges of values for the precharging of the output of the amplifier.

FIGS. 2a to 2f respectively show the shapes of the signals AM, PRECHBL, SELWL, LECT, MEM and DESEL referred to up till now. The signal SELWL is the signal that enables the validation of the word line decoder so as to concretely carry out the reading of a memory cell. When this signal is active, the decoding of the word line addresses produces voltages that are applied to the concerned word lines. This signal may be considered to be the one with reference to which their delay will be accounted for before the signal DESEL is produced in the circuit R. These signals are produced as follows. An address transition produces the signal AM and, possibly, after a known period of time, the signal SELWL. During the beginning of the signal AM, the bit lines connected to the circuits P and D by the decoder BLDEC are precharged. At the end of this precharging, the signal SELWL prompts the reading of the memory cells. In circuits of a known type, signals LECT and MEM are produced for the duration of the signal SELWL. Then, after a calibrated duration DC measured from the beginning of the signal AM (or from the signal SELWL as the case may be), the signal DESEL which is temporarily at a zero state is produced. The signal DESEL, which is temporarily at a zero state, prompts the temporary resetting of the bit lines and then their reconnection to the decoder BLDEC. In this case, the memory is once again available to start the precharging of the bit lines as soon as a next address transition is received. There is no longer any need to wait for the preliminary resetting before starting this precharging operation. In practice, it is possible to make do with a signal AM having a duration that is long enough so that, once delayed, it is used as such for an efficient resetting of the bit lines or word lines. Thus, the signal DESEL at a 0 state herein has the same duration as the signal AM at a 1 state.

However, it may be desired to have the signal DESEL at zero last up to a following address transition. In this case, the signal DESEL may be produced by a D-type flip-flop circuit which receives the signal DESEL as an input and the delayed signal AM as a clock input. In this case, the duration of the signal DESEL is not limited to that of the signal AM which is then preferably short.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. An integrated circuit memory having a cell that is connected to at least one select line, the integrated circuit memory comprising:

a preactivation circuit, connected to the at least one select line, that places the at least one select line into a preactivation state, the preactivation state being either of a high impedance or a first voltage;

a precharging circuit, connected to the at least one select line, that precharges the at least one select line to a second voltage that is different from the first voltage;

an access circuit, controlled by an access signal, that accesses the cell, the access of the cell including one of a read, write, and read-write of an electrical state of the cell; and a delay circuit, activated by the access circuit, that places the at least one select line into the preactivation state with a calibrated delay following an access of the cell.

2. The integrated circuit memory of claim 1, wherein the at least one select line includes a plurality of bit lines, and wherein the integrated circuit memory further includes:

a plurality of cells respectively coupled to the plurality of bit lines; and a connection circuit that connects the plurality of bit lines together when the preactivation circuit places the at least one select line into the preactivation state.

3. The integrated circuit memory of claim 1, wherein the delay circuit comprises a cascade of series-connected inverter circuits and a capacitor, the capacitor being connected between a reference voltage and a midpoint between two of the inverter circuits.

4. The integrated circuit memory of claim 1, wherein the integrated circuit memory has a nominal cycle time, and wherein the delay circuit produces a first calibrated delay equal to the nominal cycle time.

5. The integrated circuit memory of claim 1, further including a storage circuit that saves the electrical state of the cell during a read access.

6. The integrated circuit memory of claim 5, wherein the integrated circuit memory has a nominal cycle time, and wherein the delay circuit produces a delay that is greater than the nominal cycle time.

7. The integrated circuit memory of claim 1, wherein the preactivation state is a state of high impedance, and the memory cell is an EPROM cell.

8. The integrated circuit memory of claim 1, wherein the preactivation state is the first voltage, and the memory cell is an EEPROM cell.

9. The integrated circuit memory of claim 1, wherein the at least one select line comprises at least one bit line.

10. The integrated circuit memory of claim 1, wherein the at least one select line comprises at least one word line.

11. The integrated circuit memory of claim 2, wherein the integrated circuit memory has a nominal cycle time, and wherein the delay circuit produces a first calibrated delay equal to the nominal cycle time.

12. The integrated circuit memory of claim 11, wherein the delay circuit further produces a second calibrated delay during a read access that is greater than the nominal cycle time; and wherein the integrated circuit memory further includes a storage circuit that stores the electrical state of the cell during the read access.

13. The integrated circuit memory of claim 12, wherein the delay circuit comprises a cascade of series-connected inverter circuits and a capacitor, the capacitor being connected between a reference voltage and a midpoint between two of the inverter circuits.

14. The integrated circuit memory of claim 4, wherein the delay circuit further produces a second calibrated delay that is greater than the nominal cycle time during a read access.

15. A method for controlling an access cycle of a memory, the memory having a cell connected to a select line, the cell having an electrical state, the method comprising the steps of:

A precharging the select line to a precharged state;

B activating the select line to an activated state wherein the electrical state of the cell is accessed; and C after performing step B, placing the select line into a preactivated state that is different from the precharged and activated states.

16. The method of claim 15, Wherein step B includes activating the select line to read the electrical state of the cell, and wherein the method further includes the steps of:

prior to performing step C, storing the state of the cell; and after performing step C, writing the stored state to the cell.

17. The method of claim 16, wherein the memory includes a plurality of cells respectively coupled to a plurality of select lines, and wherein step B includes a step of connecting the plurality of select lines together.

18. The method of claim 17, wherein step C includes setting the select line to a predetermined voltage.

19. The method of claim 16, wherein step C includes placing the select line into a state of high impedance.

20. The method of claim 15, wherein the memory includes a plurality of cells respectively coupled to a plurality of select lines, and wherein step B includes a step of connecting the plurality of select lines together.

21. The method of claim 15, wherein step C includes placing the select line into a state of high impedance.

22. The method of claim 15, wherein step C includes setting the select line to a predetermined voltage.

23. A memory having a select line and a cell coupled together, the memory comprising:

a precharge circuit, coupled to the select line, that precharges the select line to a precharged state;

an access circuit that places the cell into an access state during an access clock cycle, the access state being one of a read, write, and read-write state of the cell; and first means for placing the select line into a preactivated state during the access clock cycle and after the cell has been placed into the access state, the preactivated state being different from the precharged state and the access state.

24. The memory of claim 23, wherein the access state is a read state, and wherein the memory further includes means for storing the state of the cell prior to the first means placing the select line into the preactivated state.

25. The memory of claim 24, wherein the memory further includes:

a plurality of select lines respectively coupled to a plurality of cells; and means for connecting the plurality of select lines together when the first means places the select line into the preactivated state.

26. The memory of claim 25, wherein the first means includes means for setting the select line to a predetermined voltage.

27. The memory of claim 24, wherein the first means includes means for placing the select line into a state of high impedance.

28. The memory of claim 23, wherein the memory further includes:

a plurality of select lines respectively coupled to a plurality of cells; and means for connecting the plurality of select lines together when the first means places the select line into the preactivated state.

29. The memory of claim 23, wherein the first means includes means for placing the select line into a state of high impedance.

30. The memory of claim 23, wherein the first means includes means for setting the select line to a predetermined voltage.

31. The memory of claim 30, wherein the memory further includes:

a plurality of select lines respectively coupled to a plurality of cells; and means for connecting the plurality of select lines together when the first means places the select line into the preactivated state.

32. A method for accessing an electrical state of a memory cell during an access cycle of a memory, the memory cell being coupled to a select line having a precharge state, an access state and a preactivation state, the preactivation state being either of a high impedance and a predetermined voltage, the method comprising the steps of:

A setting the state of the select line to the precharge state during the access cycle;

B following step A, changing the state of the select line from the precharge state to the access state to access the electrical state of the memory cell; and C following step B, changing the state of the select line from the access state to the preactivation state before the end of the access cycle.

33. The method of claim 32, wherein step B further includes the steps of:

storing the electrical state of the memory cell; and rewriting the electrical state to the memory cell.

34. The method of claim 33, wherein the memory includes a plurality of select lines and a plurality of memory cells, the plurality of memory cells being respectively coupled to the plurality of select lines, and wherein step C further includes connecting the plurality of select lines together.

35. The method of claim 32, wherein the memory includes a plurality of select lines and a plurality of memory cells, the plurality of memory cells being respectively coupled to the plurality of select lines, and wherein step C further includes connecting the plurality of select lines together.

36. A circuit for accessing the electrical state of a memory cell during an access cycle of a memory, the memory cell being coupled to a select line having a precharge state, an access state and a preactivation state, the preactivation state being either of a high impedance and a predetermined voltage, the circuit comprising:

first means for setting the state of the select line to the precharge state at a first time during the access cycle;

second means for changing the state of the select line from the precharge state to the access state to access the electrical state of the memory cell at a second time during the access cycle; and third means for changing the state of the select line from the access state to the preactivation state at a third time during the access cycle, wherein the first time precedes the second time during the access cycle, and the second time precedes the third time during the access cycle.

37. The circuit of claim 36, wherein the second means further includes:

means for storing the electrical state of the cell; and means for rewriting the electrical state to the memory cell.

38. The circuit of claim 37, wherein the memory includes a plurality of memory cells and a plurality of select lines, the plurality of select lines being respectively coupled to the plurality of memory cells, and wherein the third means further includes means for connecting the plurality of select lines together.

39. The circuit of claim 36, wherein the memory includes a plurality of memory cells and a plurality of select lines, the plurality of select lines being respectively coupled to the plurality of memory cells, and wherein the third means further includes means for connecting the plurality of select lines together.

40. The integrated circuit memory of claim 5, wherein the preactivation state is a state of high impedance, and the memory cell is an EPROM cell.

41. The integrated circuit memory of claim 5, wherein the preactivation state is the first voltage, and the memory cell is an EEPROM cell.

\* \* \* \* \*